US011260655B2

(12) United States Patent
Izawa et al.

(10) Patent No.: US 11,260,655 B2
(45) Date of Patent: Mar. 1, 2022

(54) INK-JET PRINTER

(71) Applicant: MIYAKOSHI PRINTING MACHINERY CO., LTD., Narashino (JP)

(72) Inventors: Hideo Izawa, Narashino (JP); Wataru Itabashi, Narashino (JP); Mizuki Sugahara, Narashino (JP)

(73) Assignee: MIYAKOSHI PRINTING MACHINERY CO., LTD., Narashino (JP)

( * ) Notice: Subject to any disclaimer, the term of this patent is extended or adjusted under 35 U.S.C. 154(b) by 0 days.

(21) Appl. No.: 16/450,028

(22) Filed: Jun. 24, 2019

(65) Prior Publication Data

US 2020/0290344 A1 Sep. 17, 2020

(30) Foreign Application Priority Data

Mar. 15, 2019 (JP) ............................ JP2019-048805

(51) Int. Cl.
*B41J 2/18* (2006.01)
*B41J 2/045* (2006.01)
(Continued)

(52) U.S. Cl.
CPC ....... *B41J 2/04563* (2013.01); *B41J 2/17596* (2013.01); *B41J 2/185* (2013.01); *B41J 29/377* (2013.01)

(58) Field of Classification Search
None
See application file for complete search history.

(56) References Cited

U.S. PATENT DOCUMENTS 7,901,063 B2 * 3/2011 Wouters ............... B41J 2/17556 347/89
7,980,683 B2 7/2011 Bansyo
(Continued)

FOREIGN PATENT DOCUMENTS

CN 105934348 A * 9/2016 ....... B29C 45/14467
EP 3072696 A1 9/2016
(Continued)

OTHER PUBLICATIONS

Hirose, T, Circulation Type Inkjet Head Apparatus, Feb. 7, 2013 Japan, All Pages (Year: 2013).*
(Continued)

*Primary Examiner* — Erica S Lin
*Assistant Examiner* — Tracey M McMillion
(74) *Attorney, Agent, or Firm* — Flynn Thiel, P.C.

(57) ABSTRACT

An ink-jet printer including a printing part that is provided with a plurality of printing heads and a distribution tank, a buffer tank, a heat exchanger, a manifold, a main flow pipe that successively connects the buffer tank, the heat exchanger and the manifold to one another, a sub-flow pipe that connects the manifold and the buffer tank with each other, a supply flow pipe for connecting the manifold and the printing part with each other, a collection flow pipe for connecting the printing part and the buffer tank with each other, and pumps respectively installed on the sub-flow pipe, the supply flow pipe and the collection flow pipe. The main flow pipe and the sub-flow pipe constitute a first circulation flow passage for circulating ink, and the main flow pipe, the supply flow pipe and the collection flow pipe constitute a second circulation flow passage for circulating the ink.

8 Claims, 6 Drawing Sheets

(51) Int. Cl.
*B41J 2/175* (2006.01)
*B41J 2/185* (2006.01)
*B41J 29/377* (2006.01)

(56) References Cited

U.S. PATENT DOCUMENTS

| | | | | |
|---|---|---|---|---|
| 8,366,224 | B2 | 2/2013 | Yokota et al. | |
| 8,684,507 | B2 | 4/2014 | Uezawa | |
| 2010/0085396 | A1 * | 4/2010 | Yokota | B41J 2/175 347/7 |
| 2012/0325337 | A1 * | 12/2012 | Nakagawa | F24H 1/22 137/337 |
| 2013/0002772 | A1 * | 1/2013 | Hiratsuka | B41J 2/175 347/85 |
| 2014/0063088 | A1 | 3/2014 | Shibata | |
| 2015/0190838 | A1 * | 7/2015 | Kaneko | H01L 21/67017 165/104.28 |
| 2015/0375520 | A1 * | 12/2015 | Arimoto | G01L 27/002 347/6 |

FOREIGN PATENT DOCUMENTS

| | | | | |
|---|---|---|---|---|
| JP | 2009-196208 | A | | 9/2009 |
| JP | 2011-083927 | A | | 4/2011 |
| JP | 2013-028041 | A | * | 2/2013 |
| JP | 2013028041 | A | * | 2/2013 |
| JP | 2016-215626 | A | | 12/2016 |
| JP | 2016215626 | A | * | 12/2016 |

OTHER PUBLICATIONS

European Search Report for corresponding application No. 19180252.9, dated Dec. 19, 2019 (11 pages).

* cited by examiner

INK-JET PRINTER

TECHNICAL FIELD

The present invention relates to an ink-jet printer, and more specifically concerns such an ink-jet printer provided with a circulation flow passage for circulating ink.

BACKGROUND ART

In an ink-jet printer, from the viewpoint of maintaining good quality of printed objects, a stable discharge of ink is remarkably important.

However, in an ink-jet printer used for industrial purposes, in the case when a printing process is continuously carried out for a long period of time, the temperature of ink sometimes changes due to changes in environment such as heat generation or the like of the device. In this case, since the viscosity of the ink is also changed together with the temperature, the discharge amount of the ink is subsequently changed, with the result that density unevenness of the ink that causes the density of a pattern to be printed to vary with time might occur.

Moreover, regardless of whether an ink-jet printer is used industrially or not, for example, ink at the tip end of a nozzle is dried when made in contact with air, with the result that aggregation of ink components tends to sometimes occur. In this case, the aggregates cause the nozzle to clog.

To solve this problem, an ink-jet printer has been developed in which a flow passage for circulating ink is formed to adjust the temperature of ink and also to prevent ink aggregation.

For example, an ink-jet printer has been known in which, by connecting flow passages between the ink head and the upstream tank as well as the downstream tank to each other, an ink circulation passage for use in circulating ink is formed and a temperature detection means, a temperature alternation means and an ink circulation amount changing means are installed (for example, see PTL 1).

Moreover, a double-sided printer has been known in which a paper-feeding part, a transport printing part, a downstream side transport part, a paper ejecting part, an inversion part and a control part are installed and the printing part of the transport printing part discharges ink for printing an image, while circulating the ink, and four supply parts, four circulation parts, four ink-jet heads and a heat exchanger are also installed (for example, see PTL 2).

Furthermore, an ink-jet printer has been also known in which an ink-jet head, a first tank, a second tank, a circulation passage for circulating ink among the first tank, the ink-jet head and the second tank, a third tank that is connected to the circulation passage and used for storing the ink, and a tightly closing means for keeping the first tank and the second tank in a tightly closed state are installed (for example, see PTL 3).

CITATION LIST

Patent Literature

PTL 1: Japanese Patent Application Laid-Open No. 2009-196208

PTL 2: Japanese Patent Application Laid-Open No. 2011-83927

PTL 3: Japanese Patent Application Laid-Open No. 2016-215626

SUMMARY OF INVENTION

Technical Problem

However, in the ink-jet printer disclosed in PTL 1, since an ink circulation passage (circulation flow passage) is formed only among the ink head, the upstream tank and the downstream tank, drawbacks such as the temperature change in ink, the aggregation of ink or the like might occur inside an ink cartridge serving as an ink supply source. Then, even when the ink is allowed to flow into the circulation passage, the drawbacks are not solved, with the result that density unevenness in ink and clogging of the nozzle might occur.

Moreover, since the upstream tank and the downstream tank for storing ink are adopted, too much of the ink is stored causing another problem where more time is required for temperature adjustments.

In the same manner, in PTL 2, since an ink circulation passage (circulation flow passage) is formed only between the circulation part (upper tank, lower tank) and the ink-jet head, drawbacks such as the temperature change in ink, the aggregation of ink, or the like might occur inside a supply part serving as an ink supply source.

Moreover, since the upper tank and the lower tank for storing ink are adopted, too much of the ink is stored causing another problem where more time is required for temperature adjustments.

In PTL 3, although the third tank to which an ink cartridge is connected forms a circulation passage (circulation flow passage), since a heat sink is designed to function only on the circulation passage between the second tank and the third tank and since a heater is designed to function only on the circulation passage between the third tank and the first tank, a drawback is caused in that much time is required for temperature adjustments. Additionally, since a heat sink or a heater are adopted, spaces are required for the installation, and another drawback is caused in that fine adjustments of temperature become difficult.

Moreover, since the first tank, the second tank and the third tank for storing ink are adopted, too much of the ink is stored causing another problem where more time is required for temperature adjustments.

In view of the above-mentioned circumstances, the present invention has been devised, and its object is to provide an ink-jet printer that can suppress the temperature change in ink and aggregation of ink and efficiently carry out ink temperature adjustments.

Solution to Problems

After having extensively studied to solve the above-mentioned problems, the inventors of the present invention have found that by forming at least two circulation flow passages including buffer tanks, the present invention achieves in solving the above-mentioned problems.

The present invention relates to (1) an ink-jet printer having a circulation flow passage for circulating ink, which is provided with a printing part having a plurality of printing heads in which nozzles for discharging ink are formed, and a distribution tank for storing ink to be distributed to the plural printing heads, a buffer tank for storing ink, a heat exchanger for adjusting the temperature of ink, a manifold for diverging the ink passage, a main flow pipe for successively connecting the buffer tank, the heat exchanger and the manifold to one after another, a sub-flow pipe for connecting the manifold and the buffer tank to each other, a supply flow pipe for connecting the manifold and the printing part, a collection flow pipe for connecting the printing part and the buffer tank to each other, and pumps that are respectively formed in the sub-flow pipe, and the supply flow pipe and collection flow pipe so as to flow the ink. In this configuration, the main flow pipe and the sub-flow pipe constitute a first circulation flow passage for circulating the ink, and the main flow pipe, the supply flow pipe and the collection flow pipe constitute a second circulation flow passage for circulating the ink.

The present invention relates to (2) the ink-jet printer described in the above-mentioned (1) in which the distribution tank is constituted by a first distribution tank and a second distribution tank so that the first distribution tank stores ink to be supplied to the printing heads and the second distribution tank stores ink collected from the printing heads.

The present invention relates to (3) the ink-jet printer described in the above-mentioned (2) in which the collection flow pipe is constituted by a first collection flow pipe for connecting the first distribution pipe of the printing part and the buffer tank with each other and a second collection flow pipe for connecting the second distribution tank of the printing part and the buffer tank with each other, and pumps for use in flowing the ink are respectively installed on the first collection flow pipe and the second collection flow pipe.

The present invention relates to (4) the ink-jet printer described in the above-mentioned (2) or (3) in which a pressure control mechanism is attached to each of the first distribution tank and the second distribution tank so that by a pressure adjustment by the pressure control mechanism, the first distribution tank supplies ink to a printing head and the second distribution tank collects ink from the printing head.

The present invention relates to (5) the ink-jet printer described in any one of the above-mentioned (2) to (4) in which the first distribution tank and the second distribution tank are connected to each other by a bypass pipe so that ink can be directly flowed from the first distribution tank to the second distribution tank.

The present invention relates to (6) the ink-jet printer described in the above-mentioned (5) in which a solenoid valve is attached to the bypass pipe.

The present invention relates to (7) the ink-jet printer described in any one of the above-mentioned (1) to (6) in which the heat exchanger exchanges heat between the ink and water, and the temperature of the water is controlled by a chiller device.

The present invention relates to (8) the ink-jet printer described in any one of the above-mentioned (1) to (7) in which a plurality of the printing parts are installed.

Advantageous Effects of Invention

In the ink-jet printer of the present invention, since the first circulation flow passage and the second circulation flow passage are formed, it becomes possible to suppress the temperature change in ink and ink aggregation and efficiently carry out the temperature adjustment of the ink.

That is, since the first circulation flow passage is constituted by a main flow pipe and a sub-flow pipe, its flow distance is comparatively short so that the ink can be circulated efficiently. Thus, not only is the temperature change of ink inside the buffer tank prevented, but the temperature adjustment of ink stored in the buffer tank is also carried out in a comparatively short time. Moreover, it also becomes possible to suppress the aggregation of ink inside the buffer tank.

Since the second circulation flow passage is constituted by the main flow pipe that passes through the buffer tank and the heat exchanger, the supply flow pipe and the collection flow pipe, the ink, which has been temperature-adjusted inside the buffer tank, is again temperature-adjusted by the heat exchanger. Thus, the ink to be discharged from the nozzle is positively temperature-adjusted and also has its aggregation sufficiently suppressed. As a result, it becomes possible to sufficiently prevent the occurrence of density unevenness of the ink and prevent the nozzle from clogging.

In the ink-jet printer in accordance with the present invention, since the distribution tank is divided into the first distribution tank for storing ink to be supplied to the printing heads and the second distribution tank for storing ink collected from the printing heads, the ink can be flowed in one direction successively in the order from the first distribution tank, the printing heads and the second distribution tank. As a result, it becomes possible to suppress ink from stagnating in each of the distribution tanks, and also to allow the ink smoothly flow. In this case, when the ink erroneously stagnates, the unevenness of ink temperature occurs, and moreover, the aggregation of ink tends to easily occur.

Furthermore, by supplying ink from the first distribution tank, it becomes possible to prevent the ink collected into the second distribution tank from being again supplied to the printing heads.

At this time, by forming the collection flow pipe as a first collection flow pipe for connecting the first distribution tank and the buffer tank with each other and a second collection flow pipe for connecting the second distribution tank and the buffer tank with each other, even when ink stagnates inside the respective distribution tanks, the corresponding ink can be collected smoothly. That is, it becomes possible to further suppress the ink from stagnating inside the respective distribution tanks.

In the ink-jet printer of the present invention, in the case when a pressure control mechanism is attached to each of the first distribution tank and the second distribution tank, by adjusting the pressure of each distribution tank by the corresponding pressure control mechanism, ink inside the first distribution tank is supplied to the printing heads, and of the ink, that which is not discharged from the printing heads is collected into the second distribution tank from the printing heads.

In this manner, by carrying out flow of ink among the respective distribution tanks by the use of not pumps, but the pressure control mechanisms, the amount of ink flow among the respective distribution tanks can be controlled comparatively easily.

In the ink-jet printer of the present invention, by connecting the first distribution tank and the second distribution tank by a bypass pipe, ink is further suppressed from stagnating inside each of the distribution tanks.

At this time, by attaching a solenoid valve to the bypass pipe, the opening/closing process of the bypass pipe can be controlled.

In the ink-jet printer of the present invention, by using a heat exchanger to exchange heat between ink and water, it becomes possible to reduce temperature unevenness in the heat exchanger and moderately carry out temperature adjustments of the ink.

Additionally, in the case of temperature adjustments of the ink by heating by a heater, there is a tendency to cause a temperature difference between ink in contact with the heater and ink that is not in contact with the heater. Moreover, since the ink in contact with the heater has a high temperature, the ink might be deteriorated. Incidentally, in the prior art, a method has been known where the temperature of the ink inside the distribution tank is adjusted by attaching a heater to the distribution tank; however, since this case hardly causes convection of the ink, the above-mentioned temperature difference occurs easily.

In contrast, by adopting the above-mentioned heat exchanger, since the ink temperature is controlled by water that is controlled to a set temperature, the ink is prevented from being overheated.

Moreover, by installing it in the circulation passage, the ink temperature can be made uniform.

Furthermore, since the water temperature is controlled by the chiller device, the temperature adjustment can be carried out more accurately.

In the ink-jet printer of the present invention, by installing a plurality of the printing parts, the printing process can be carried out efficiently while suppressing the temperature change in ink and the aggregation of ink.

BRIEF DESCRIPTION OF DRAWINGS

FIG. 2(*b*) is a top view of FIG. 2(*a*).

DESCRIPTION OF EMBODIMENTS

Figure 1:
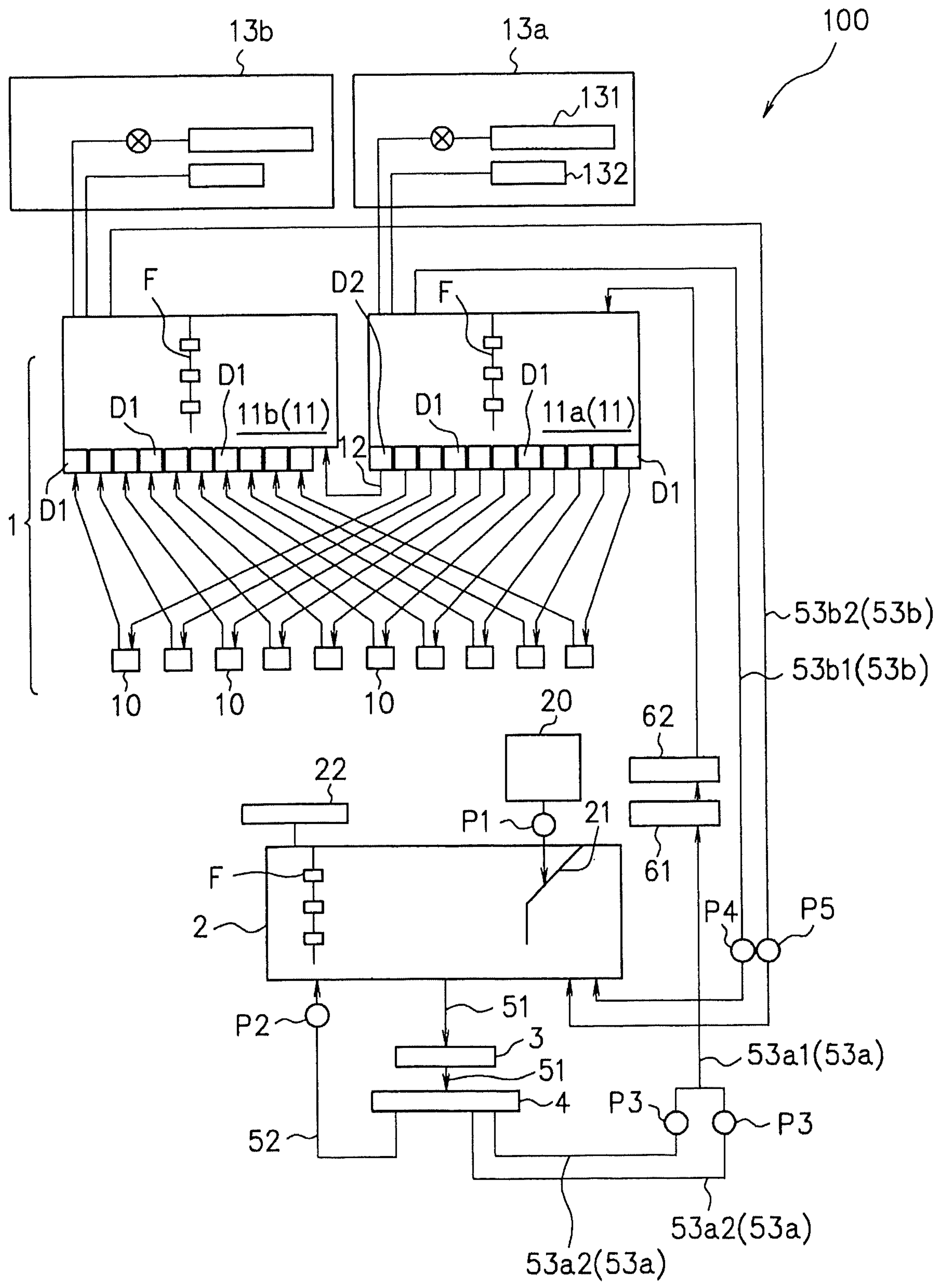
FIG. 1 is a schematic view showing an ink-jet printer in accordance with the present embodiment.

With reference to the Figures, an explanation will be given on a desired embodiment of the present invention in detail. Additionally, in the Figures, the same elements are indicated by the same reference numerals, and overlapping explanations will be omitted. Moreover, the positional relationship, such as longitudinal directions, lateral directions and the like, is determined based upon the positional relationship shown in the drawing unless otherwise specified. Furthermore, the dimensional ratio of the drawing is not intended to be limited by the ratio shown in the drawing.

FIG. 1 is a schematic view showing an ink-jet printer in accordance with the present invention.

As shown in FIG. 1, an ink-jet printer 100 in accordance with the present invention is provided with a printing part 1 for applying ink onto a printing medium, a buffer tank 2 for storing ink, a heat exchanger 3 for adjusting the temperature of the ink, a manifold 4 for diverging the ink passage and flow pipes that connect these with one another.

Moreover, the flow pipes include a main flow pipe 51 that successively connect the buffer tank 2, the heat exchanger 3 and the manifold 4 with one another, a sub-flow pipe 52 that connects the manifold 4 and the buffer tank 2 with each other, a supply flow pipe 53*a* that connects the manifold 4 and the printing part 1, and a collection flow pipe 53*b* that connects the printing part 1 and the buffer tank 2 with each other.

In this manner, in the ink-jet printer 100, a first circulation flow passage for circulating ink through the main flow pipe 51 and the sub-flow pipe 52 is formed, and a second circulation flow passage for circulating ink among the main flow pipe 51, the supply flow pipe 53*a* and the collection flow pipe 53*b* is also formed. Additionally, these will be described later in detail.

In the ink-jet printer 100, since the first circulation flow passage and the second circulation flow passage are formed, the temperature change in ink and the aggregation of the ink can be suppressed, and the temperature adjustment of the ink can also be efficiently carried out.

Additionally, with respect to members for the flow pipe, the connection pipe to be described later, and the bypass pipe to be described later, known tubes or the like can be used on demand. Additionally, these members may be the same or may be different from one another.

In the ink-jet printer 100, pumps P are respectively installed on the sub-flow pipe 52, the supply flow pipe 53*a* and the collection flow pipe 53*b*, and the ink is allowed to flow through the flow pipes by these pumps P.

On the other hand, the ink flow inside the printer part 1 is carried out by a pressure control mechanism, which will be described later.

In this manner, by carrying out the flow of the ink among the respective distribution tanks by the use of pressure control mechanisms rather than the pumps, the amount of ink flow among the respective distribution tanks can be controlled comparatively easily.

Therefore, in the ink-jet printer, the ink is allowed to flow by the pumps P and the pressure control mechanism.

In the ink-jet printer 100, the ink is successively discharged from nozzles of the plural printing heads 10 of the printer part 1 toward a printing medium (not shown) that is successively supplied.

In this case, as the ink, not particularly limited, that which is commercially available may be adopted on demand. More specifically, for example, such an ink formed by including a colorant such as a dye, a pigment or the like, an aqueous solvent and a known additive, applied, if necessary, may be used.

Moreover, as the printing medium not particularly limited, that which is commercially available may be adopted on demand. More specifically, for example, paper, cloth, non-woven fibers, film, metal foil or the like may be adopted. Additionally, with respect to this, an ink receiving layer for receiving ink may be formed on the surface to which the ink is applied.

Additionally, the printing medium on which ink has been printed is, for example, dried by a drying device, and then collected.

In the ink-jet printer 100, the printing part 1 is provided with a plurality of printing heads 10 on each of which a nozzle for discharging ink is formed and a distribution tank 11 for use in storing ink to be distributed to the plural printing heads 10.

Moreover, the nozzle is formed on each printing head 10 so that ink can be discharged from the nozzle.

In the case when, for example, aggregates are contained in the ink, these cause clogging in the nozzle.

The printing heads 10 are constituted as a line head system. That is, the ink-jet printer 100 has the system in which the fixed printing heads 10 carry out printing processes on a printing medium that is transported.

In the ink-jet printer 100 of the line head system, since the printing process is carried out at high speed, the yield can be remarkably improved by preventing clogging of the ink.

The distribution tank 11 is constituted by a first distribution tank 11*a* and a second distribution tank lib.

Each of the first distribution tank 11*a* and the second distribution tank 11*b* is provided with a float switch F installed inside thereof.

This float switch F makes it possible to detect three points, that is, an upper limit position, an appropriate position and a lower limit position, of the liquid surface of the ink inside each of the distribution tanks 11*a* and 11*b*.

In each of the distribution tanks 11*a* and 11*b*, an inflow of ink or an outflow of ink is carried out depending on the position of the liquid surface of the ink detected by the float switch F.

In the ink-jet printer 100, to the first distribution tank 11*a* and the second distribution tank 11*b*, a thermocouple for measuring the temperature of ink stored therein is attached. Thus, the temperature of the ink stored in each of the distribution tanks 11 can be managed.

Additionally, based upon the temperature thus obtained, the temperature adjustment of ink is carried out by a heat exchanger to be described later.

The first distribution tank 11*a* and the second distribution tank 11*b* are respectively connected to the plural printing heads 10 commonly used through connection pipes. In other words, each of the printing heads 10 is connected to the first distribution tank 11*a* and the second distribution tank 11*b* through the connection pipes.

Thus, the inside of the first distribution tank 11*a* and the insides of the respective printing heads 10 directly communicate with each other through the corresponding connection pipe, and the insides of the respective printing heads 10 and the inside of the second distribution tank 11*b* directly communicate with each other through the corresponding connection pipe.

In the ink-jet printing device 100, the ink stored in the first distribution tank 11*a* is respectively supplied to the plural printing heads 10 and discharged from those printing heads.

Moreover, the ink which has not been discharged from the plural printing heads 10 is collected by the second distribution tank 11*b*, and temporarily stored in the second distribution tank 11*b*.

Since the ink-jet printer 100 is provided with the first distribution tank 11*a* and the second distribution tank 11*b*, the flow of the ink can be in one direction. Thus, the ink can flow smoothly so that it becomes possible to more effectively suppress the ink from stagnating inside the first distribution tank 11*a* and the second distribution tank 11*b*.

Moreover, by allowing the ink to flow in one direction, the ink collected into the second distribution tank lib is prevented from being supplied to the printing heads 10 again.

In the ink-jet printer 100, on a connection pipe between the first distribution tank 11*a* and the respective printing heads 10 connected thereto, as well as on a connection pipe between the second distribution tank 11*b* and the respective printing heads 10 connected thereto, solenoid valves D1 capable of opening/closing the ink flow passage are installed. For this reason, by controlling the opening/closing of the solenoid valves D1, the printing heads 10 for supplying ink or for collecting ink can be selected on demand in the ink-jet printer 100.

In the ink-jet printer 100, a supply flow pipe 53*a* for supplying ink and a collection flow pipe 53*b* for collecting ink are attached to the distribution tanks 11.

More specifically, the supply flow pipe 53*a* and the collection flow pipe 53*b* (hereinbelow, referred to conveniently as "first collection flow pipe 53*b*1") are attached to the first distribution tank 11*a*, and the collection flow pipe 53*b* (hereinbelow, referred to conveniently as "second collection flow pipe 53*b*2") is attached to the second distribution tank lib. That is, in the ink-jet printer 100, the collection flow pipe 53*b* is attached not only to the second distribution tank lib, but also to the first distribution tank 11*a*.

In the first distribution tank 11*a*, one portion of the ink from the supply flow pipe 53*a* is supplied to the printing heads 10, while the other portion of the ink is collected into the buffer tank 2 from the first collection flow pipe 53*b*1. Thus, the ink to be stored into the first distribution tank 11*a* can be maintained in a fresh state. Additionally, in order to prevent the ink from stagnating inside the first distribution tank 11*a*, the supply flow pipe 53*a* and the first collection flow pipe 53*b*1 are desirably attached so as to be separated from each other as far as possible.

On the other hand, in the second distribution tank 11*b*, the ink collected from the printing heads 10 is collected into the buffer tank 2 from the second collection flow pipe 53*b*2, as described above.

In the ink-jet printer 100, the first distribution tank 11*a* and the second distribution tank lib are connected to each other by a bypass pipe 12. Thus, ink can directly flow into the second distribution tank 11*b* from the first distribution tank 11*a*.

In the ink-jet printer 100, by installing the bypass pipe 12, it is possible to further suppress the ink from stagnating inside the first distribution tank 11*a* and the second distribution tank 11*b*.

In this case, a solenoid valve D2 capable of opening/closing its flow passage is attached to the bypass pipe 12 in the ink-jet printer 100. Thus, it becomes possible to control the opening/closing of the bypass pipe 12. For example, at the time of normal printing, the bypass pipe 12 is opened to suppress the ink from stagnating, and at the time of purging or the like, the bypass pipe 12 can be closed so as to apply a special pressure to the printing heads 10.

In the ink-jet printer 100, pressure control mechanisms 13*a* and 13*b* are respectively attached to the first distribution tank 11*a* and the second distribution tank 11*b*.

In the first distribution tank 11*a*, the pressure control mechanism 13*a* is provided with a pressure adjusting device 131 for pressurizing or depressurizing the pressure of an upper space (hereinafter, referred to as "inner space") of the ink stored inside the first distribution tank 11*a*, a release valve (not shown) for making the pressure of the inner space of the first distribution tank 11*a* set to the atmospheric pressure, and a pressure meter 132 for measuring the pressure of the inner space of the first distribution tank 11*a*.

As the pressure adjusting device 131, a compressor, a vacuum pump, a tube pump, a diaphragm pump and the like may be desirably used. Any one of these may be used alone or a plurality of these may be used in combination.

In the pressure control mechanism 13*a*, the pressure inside the inner space of the first distribution tank 11*a* is measured by the pressure meter 132. Based upon the measured value, a controlling process can be carried out by the pressure adjusting device 131.

Additionally, the pressure adjusting device 131 and the releasing valve may be directly connected respectively to the inner space of the first distribution tank 11*a* independently, or may be connected to the inner space of the first distribution tank 11*a* and then connected to an air chamber or the like that has a pressure in common with the pressure of the inner space.

Moreover, the pressure control mechanism 13*b* attached to the second distribution tank 11*b* has a structure in common with the structure of the pressure control mechanism

13*a* attached to the first distribution tank 11*a*; therefore, explanation thereof will be omitted.

In the ink-jet printer 100, by making the pressure of the inner space of the first distribution tank 11*a* higher than the pressure of the inner space of the second distribution tank 11*b* by using the pressure control mechanism 13*a*, ink is allowed to flow from the first distribution tank 11*a* toward the printing heads 10 and further to flow from the printing heads 10 toward the second distribution tank lib.

At this time, the adjustment of the pressure may be carried out by depressurizing both of the inner spaces of the first distribution tank 11*a* and the second distribution tank lib, with the inner space of the second distribution tank lib being set to a pressure lower than the inner space of the first distribution tank 11*a* to provide a pressure difference between them, or the pressure difference may be set by pressurizing the inner space of the first distribution tank 11*a* and by depressurizing the inner space of the second distribution tank 11*b*.

The buffer tank 2 is a tank forming an ink supply source.

In the ink-jet printer 100, ink packs 20 are attached so as to have the insides thereof communicated with each other through a connection pipe into the buffer tank 2. Additionally, the ink packs 20 are freely detachably attached to the connection pipe.

Moreover, a pump P1 (hereinafter, referred to conveniently as "ink-pack use pump P1") is attached to the connection pipe. By this ink-pack use pump P1, ink is flowed through the connection pipe.

The inside of the buffer tank 2 communicates with outside air through an air filter 22. That is, the inside of the buffer tank 2 is set to the atmospheric pressure.

Moreover, the buffer tank 2 is provided with a float switch F installed therein.

This float switch F makes it possible to detect three points, which are an upper limit position, an appropriate position and a lower limit position, of the liquid surface of the ink inside the buffer tank 2.

Thus, in the buffer tank 2, an inflow (a replenishment) of ink from the ink pack 20 is carried out depending on the position of the liquid surface of the ink detected by the float switch F.

In the buffer tank 2, a slanting part 21 for allowing the inflow ink to collide therewith is installed. Therefore, the ink replenished from the ink pack 20 is made to collide against the slanting part 21 to drop down along the slanting part so as to be stored inside the buffer tank 2. Thus, when replenishing ink, it becomes possible to suppress the ink from containing air as effectively as possible.

In this case, when air contained in the ink exceeds a fixed amount, it causes bubbles, with the result that the ink discharge becomes unstable since the bubbles serve as air cushion inside the nozzle of the printing heads 10.

The heat exchanger 3 is a device for adjusting the temperature of ink.

As the heat exchanger 3, a heat exchanger that exchanges heat between the ink and water is desirably used.

Figure 2:
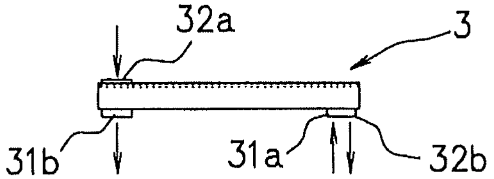
FIG. 2(*a*) is a side view that shows an outline of a heat exchanger in the ink-jet printer in accordance with the present embodiment.
Figure 2:
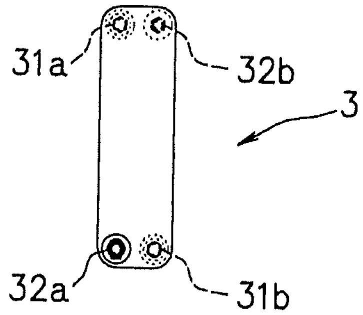
Figure 3:
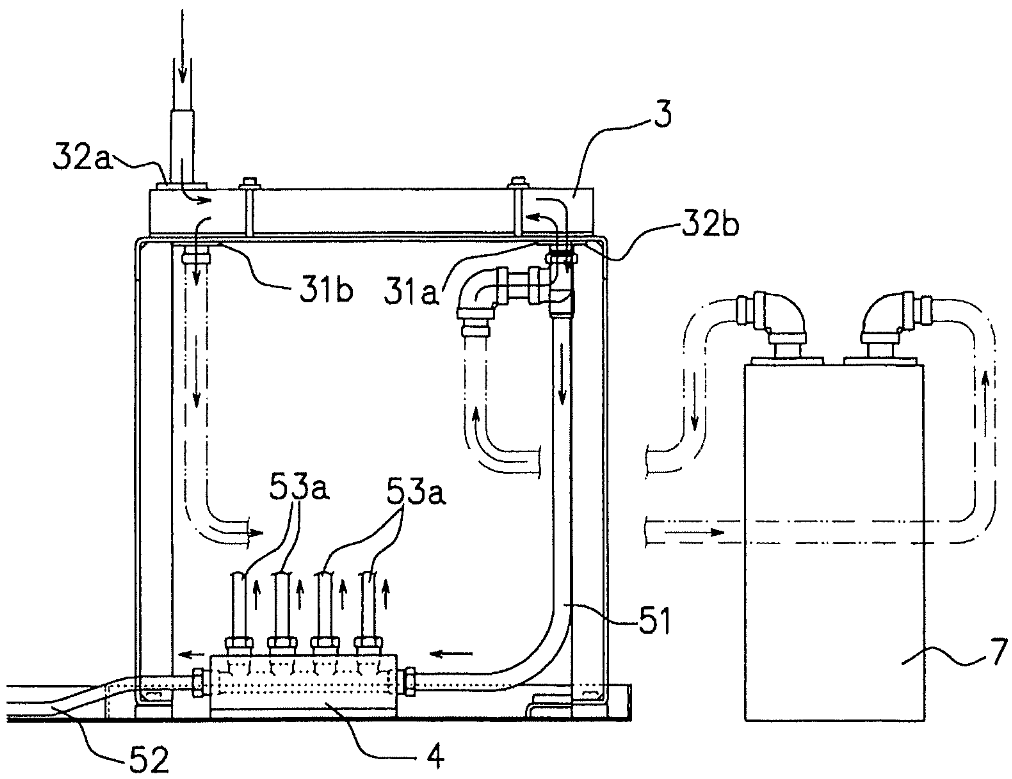
FIG. 3 is a partially transparent side view showing the heat exchanger and a manifold in the ink-jet printer in accordance with the present embodiment.

FIG. 2(*a*) is a side view that shows an outline of a heat exchanger in the ink-jet printer in accordance with the present embodiment, FIG. 2(*b*) is a top view of FIG. 2(*a*), and FIG. 3 is a partially transparent side view showing the heat exchanger and a manifold in the ink-jet printer in accordance with the present embodiment.

As shown in FIG. 2(*a*) and FIG. 2(*b*), the heat exchanger 3 is constituted by a water circuit (not shown) that allows water to flow in from a water flow inlet 31*a* and also to flow out from a water outlet 31*b* and an ink circuit (not shown) that allows ink to flow in from an ink flow inlet 32*a* and also to flow out from an ink flow outlet 32*b*.

In the heat exchanger 3, the temperature adjustment of ink that flows through the ink circuit is carried out by water that flows through the water circuit. Thus, the heat exchanger 3 makes it possible to reduce temperature unevenness in the entire heat exchanger 3 and also to carry out the temperature adjustment of ink more moderately.

Additionally, the temperature of water to be flowed through the heat exchanger 3 is set on demand depending on the ink. For example, the temperature is set in a range from 25 to 40° C.

As shown in FIG. 3, the temperature of water to be flowed through the water circuit is controlled by a chiller device 7.

In this case, that which is conventionally known may be adopted as the chiller device 7. The chiller device 7 is provided with a cooling part, a heating part and a control part for controlling these.

Thus, since the adjustment of the water temperature can be carried out with high accuracy, the adjustment of the temperature of ink to be flowed through the ink circuit can also be carried out more precisely.

The manifold 4 is installed below the heat exchanger 3.

The manifold 4 is provided with a plurality of channels so that the flow passage of ink can be diverged. That is, the ink flowed into the manifold 4 can be flowed out in a plurality of directions. Additionally, the channel that is not used can be closed on demand.

In the ink-jet printer 100, a main flow pipe 51, a sub-flow pipe 52 and a supply flow pipe 53*a* are attached to the channels of the manifold 4. Therefore, the ink flowed out through the ink flow outlet of the heat exchanger 3 into the main flow pipe 51, which is temperature-adjusted, is flowed into the manifold 4. The resulting ink is flowed from the manifold 4 into the first distribution tank 11*a* through the buffer tank 2 and the supply flow pipe 53*a* by way of the sub-flow pipe 52.

Returning back to FIG. 1, in the ink-jet printer 100, the main flow pipe 51 is constituted by successively connecting the buffer tank 2, the heat exchanger 3 and the manifold 4 to allow ink to pass therethrough.

Moreover, the sub-flow pipe 52 connects the manifold 4 and the buffer tank 2 with each other to allow ink to pass therethrough.

Furthermore, to the sub-flow pipe 52, a pump P2 (hereinafter, referred to conveniently as "sub-flow pipe pump P2") for allowing the ink to flow from the manifold 4 to the buffer tank 2 is attached.

In the ink-jet printer 100, when the sub-flow pipe pump P2 is operated, the ink is flowed continuously in one direction through the main flow pipe 51 and the sub-flow pipe 52.

In this manner, the first circulation flow passage is formed by the main flow pipe 51 and the sub-flow pipe 52 so as to circulate ink in the ink-jet printer 100.

Since the first circulation flow passage is constituted by the main flow pipe 51 and the sub-flow pipe 52, the flow distance is comparatively short so that the ink can be efficiently circulated.

Moreover, since the ink flowing through the main flow pipe 51 is allowed to pass through the heat exchanger 3, its temperature is adjusted.

Because of these, the ink-jet printer 100 makes it possible not only to prevent the temperature change of ink inside the buffer tank 2, but also to carry out the temperature adjustment on the ink stored in the buffer tank 2 in a comparatively short period of time. Moreover, it is also possible to suppress the aggregation of ink inside the buffer tank 2.

In the ink-jet printer 100, the supply flow pipe 53*a* connects the first distribution tank 11*a* of the printing part 1 and the manifold 4 with each other to allow the ink to flow therethrough.

In this case, the supply flow pipe 53*a* is constituted by a downstream supply flow pipe 53*a*1 connected to the first distribution tank 11*a* and two upstream supply flow pipes 53*a*2 that are branched from the corresponding downstream supply flow pipe 53*a*1 and connected to the manifold 4.

Moreover, to the two upstream supply flow pipes 53*a*2, pumps P3 (hereinafter, referred to conveniently as "supply flow pipe pumps P3") that allow the ink to respectively flow from the manifold 4 to the downstream supply flow pipe 53*a*1 are attached.

Furthermore, to the downstream supply flow pipe 53*a*1, a filter 61 for filtering the ink and a deaeration device 62 for excluding air dissolved in the ink are attached.

In the ink-jet printer 100, in accordance with the amount of ink that is desirably flowed, the supply flow pipe pumps P3 to be operated can be selected. For example, when both of the supply flow pipe pumps P3 are operated, ink is flowed into the two upstream supply flow pipes 53*a*2 from the manifold 4, and the ink is next flowed into the downstream supply flow pipes 53*a*1 from the two upstream supply flow pipes 53*a*2.

In the ink-jet printer 100, the collection flow pipe 53*b* connects the printing part 1 and the buffer tank 2 with each other to allow the ink to flow therethrough.

In this case, as described earlier, the collection flow pipe 53*b* is constituted by the first collection flow pipe 53*b*1 that connects the first distribution tank 11*a* and the buffer tank 2 with each other and the second collection flow pipe 53*b*2 that connects the second distribution tank lib and the buffer tank 2 with each other.

Moreover, pump P4 (hereinafter, referred to conveniently as "first collection flow pipe pump P4") that allows the ink to flow from the first distribution tank 11*a* to the buffer tank 2 is attached to the first collection flow pipe 53*b*1, and pump P5 (hereinafter, referred to conveniently as "second collection flow pipe pump P5") that allows the ink to flow from the second distribution tank lib to the buffer tank 2 is attached to the second collection flow pipe 53*b*2.

In the ink-jet printer 100, when the first collection flow pipe pump P4 is operated, ink is flowed from the first distribution tank 11*a* to the buffer tank 2. When the second collection flow pipe pump P5 is operated in the same manner, the ink is flowed into the buffer tank 2 from the second distribution tank 11*b*.

In this manner, in the ink-jet printer 100, the second circulation flow passage is formed by the above-mentioned main flow pipe 51, the supply flow pipe 53*a* and the collection flow pipe 53*b* to circulate ink.

Since the second circulation flow passage is constituted by the main flow pipe 51 that passes through the buffer tank 2 and the heat exchanger 3, the supply flow pipe 53*a*, and the collection flow pipe 53*b*, the ink that is temperature-adjusted inside the buffer tank 2 is again temperature-adjusted by the heat exchanger 3 at the time of passing through main flow pipe 51. Then, the ink is allowed to flow to the first distribution tank 11*a* from the manifold 4 through the supply flow pipe 53*a*. Thus, the ink discharged from the nozzle can be positively temperature-adjusted and its aggregation is sufficiently suppressed. As a result, it becomes possible to sufficiently prevent the occurrence of density unevenness of ink and nozzle clogging.

Next, an explanation will be provided of an example of using the ink-jet printer 100 in accordance with the present embodiment.

[Normal Printing Time]

(Ink Flow in the First Circulation Flow Passage)

At a normal printing time, the sub-flow pipe pump P2 is, for example, in a state where it is operated in an intermittent driving process. Thus, the temperature adjustment of ink is sufficiently carried out by the heat exchanger 3.

In this manner, the ink is allowed to flow through the first circulation flow passage.

(Ink Flow in the Second Circulation Passage)

First, in a state where all the solenoid valves D1 attached to the connection pipe between the first distribution tank 11*a* and the respective printing heads 10 and the connection pipe between the second distribution tank lib and the respective printing heads 10 are kept in the closed state, the solenoid valve D2 attached to the bypass pipe 12 is also kept in the closed state.

Then, by the pressure adjusting devices of the pressure adjustment mechanisms 13*a* and 13*b*, the inner spaces of the first distribution tank 11*a* and the second distribution tank 11*b* are depressurized so that the pressure of the inner space of the first distribution tank 11*a* is set so as to be higher than the pressure of the inner space of the second distribution tank 11*b*.

In this state, by opening the solenoid valves D1 and the solenoid valves D2, ink is allowed to flow from the first distribution tank 11*a* to the printing head 10, and is also allowed to flow from the printing head 10 to the second distribution tank 11*b*.

Moreover, the ink is allowed to flow from the first distribution tank 11*a* to the second distribution tank 11*b* through the bypass pipe 12.

Additionally, at this time, the ink is discharged from the nozzle of the printing head 10 by driving the piezoelectric element of the printing head 10.

In this manner, when the ink flows, the liquid surface of the ink inside each of the distribution tanks 11*a* and 11*b* is fluctuated.

For example, in the case when the float switch F detects that both of the liquid surfaces of ink inside the first distribution tank 11*a* and the second distribution tank 11*b* are lower than the appropriate position as the initial state, the supply flow pipe pump P3 is driven as an A1 step so that ink is supplied from the buffer tank 2 to the first distribution tank 11*a* until the liquid surface of the ink has been set to the appropriate position.

Thus, when the ink flows from the first distribution tank 11*a* to the second distribution tank 11*b* through the printing head 10 or the bypass pipe 12, the liquid surface of the ink inside the second distribution tank lib is set to the appropriate position, while the liquid surface of the ink inside the first distribution tank 11*a* becomes lower than the appropriate position.

Moreover, as an A2 step, the second collection flow pipe pump P5 is driven so that ink is collected from the second distribution tank 11*b* to the buffer tank 2 until the liquid surface of the ink has become lower than the appropriate position.

Thus, since both of the liquid surfaces of the ink in the first distribution tank 11*a* and the second distribution tank 11*b* become lower than the appropriate position, the above-mentioned initial state is restored. Additionally, the initial state, the A1 step and the A2 step are successively repeated.

Thus, the ink flowing process in the second circulation flow passage is carried out.

Additionally, in the case when the float switch F has detected that the liquid surface of ink inside the first distribution tank 11*a* or the second distribution tank 11*b* is located at the upper limit position or the lower limit position, all the solenoid valves D1 are closed so that the supply flow pipe pump P3, the first collection flow pipe pump P4 and the second collection flow pipe pump P5 are stopped, and the inner spaces of the first distribution tank 11*a* and the second distribution tank lib are released to the atmosphere by the corresponding pressure adjustment mechanism.

[Immediately after Energization of Ink-Jet Printer]

(Ink Flow in the First Circulation Flow Passage)

At the normal printing time, the sub-flow pipe pump P2 is operated in an intermittent driving state; however, immediately after energization, the intermittent driving process is carried out in a mode in which the stopping time of the sub-flow pipe pump P2 is made shorter. Additionally, these driving time and stopping time can be desirably set.

Moreover, the temperature of water to be flowed through the heat exchanger 3 is made higher by the chiller device 7.

By carrying out processes other than these in the same manner as in the normal printing time, the ink flowing process in the first circulation flow passage is carried out.

(Ink Flow in the Second Circulation Flow Passage)

Immediately after energization of the ink-jet printer 100, the amount of ink flow is increased than that in the above-mentioned "ink flow in the second circulation flow passage at the normal printing time".

More specifically, in the same manner as in the normal printing time, the inner spaces of the first distribution tank 11*a* and the second distribution tank lib are depressurized. At this time, the pressure of the inner space of the first distribution tank 11*a* is set to be higher than the pressure of the inner space of the second distribution tank 11*b*. That is, the pressure difference between the two tanks is set to be greater.

Moreover, since the amount of ink flow is increased, the first collection flow pipe pump P4 is driven so that the ink is collected into the buffer tank 2 from the first distribution tank 11*a* to make the liquid surface of the ink set to the lower limit position. Additionally, when the liquid surface of the ink is set to the lower limit position, the driving of the first collection flow pipe pump P4 is stopped. When the liquid surface of the ink is set to the appropriate position, the driving of the first collection flow pipe pump P4 is started.

By carrying out processes other than these in the same manner as in the normal printing time, the ink flowing process in the second circulation flow passage is carried out.

[At the Time of Purging]

In the ink-jet printer 100, in order to eliminate the nozzle clogging due to aggregates of ink and the discharging failure of ink due to air, and also to preliminarily prevent the occurrence of the clogging and the discharging failure, a normal purging process or a circulation purging process in which the ink is forcefully discharged from the nozzle is carried out.

In these purging processes, first, all the solenoid valves D1 that are installed on the connecting pipes between the first distribution tank 11*a* and the respective printing heads 10 and the connecting pipes between the second distribution tank 11*b* and the respective printing heads 10 are closed, and the solenoid valve D2 installed on the bypass pipe 12 is also closed.

Moreover, the inner space of the first distribution tank 11*a* is pressurized by the pressure adjusting device 131 of the pressure adjustment mechanism 13*a*, and by using the release valve of the pressure adjustment mechanism 13*b*, the inner space of the second distribution tank lib is set to be the atmospheric pressure.

(Normal Purging)

In a normal purging process, by opening the solenoid valve D1 installed on the connection pipe between the first distribution tank 11*a* and each of the printing heads 10, the ink flows to the printing head 10 from the first distribution tank 11*a* so that the ink is forcefully discharged from the nozzle of the printing head 10. Thus, it becomes possible to eliminate the nozzle clogging due to aggregates of ink and the discharging failure of ink due to air.

(Circulation Purging)

In a circulation purging process, by opening all the solenoid valves D1 installed on the connection pipes between the first distribution tank 11*a* and the respective printing heads 10, as well as on the connection pipes between the second distribution tank 11*b* and the respective printing heads 10, the ink flows to the printing heads 10 from the first distribution tank 11*a* so that the ink is forcefully discharged from the nozzle of each printing head 10 so as to be flowed from the printing head 10 to the second distribution tank 11*b*. Thus, since it is possible to eliminate ink aggregates and air from the entire portion of the inside of the printing head 10, it becomes possible to more positively eliminate the nozzle clogging due to aggregates of ink and the discharging failure of ink due to air.

[Ink Initial Filling]

Upon exchanging ink or the like, ink needs to be filled in a state where the buffer tank 2, the first distribution tank 11*a*, the second distribution tank lib and the respective flow pipes, connection pipes, bypass pipe, etc. are made empty.

(Buffer Tank)

In the buffer tank 2, by driving ink-pack use pump 21, the ink is replenished from the ink pack 20 until the liquid surface of the ink inside the buffer tank 2 has reached the appropriate position.

Moreover, at the time of printing, when the float switch F detects the fact that the liquid surface of the ink inside the buffer tank is lower than the appropriate position as well, the ink is replenished from the ink pack 20. Additionally, in the case when the ink pack 20 becomes empty, the ink pack 20 can be exchanged on demand.

Thus, ink is filled into the buffer tank 2.

(First Distribution Tank)

First, the connection pipes between the first distribution tank 11*a* and the respective printing heads 10, and the connection pipes between the second distribution tank 11*b* and the respective printing heads 10, are detached. Thus, when initially filling each flow pipe, it becomes possible to suppress the printing head 10 from being erroneously mixed with a large amount of air.

Additionally, these connection pipes are desirably coupled through a connection member such as coupler or the like in which the valve is built. In this case, by allowing the connection member to close the valve, it becomes possible to suppress ink from leaking when detached.

Next, all the solenoid valves D1 installed on the connection pipes between the first distribution tank 11*a* and the respective printing heads 10 are closed, and the solenoid valve D2 installed on the bypass pipe 12 is also closed.

Moreover, by using the releasing valve of the pressure adjustment mechanism 13*a*, the inner space of the first distribution tank 11*a* is set to the atmospheric pressure.

In this state, by driving the supply flow pipe pump P3, ink flows to the first distribution tank 11*a* from the buffer tank 2 through the main flow pipe 51 and the supply flow pipe 53*a*.

Thus, the ink is filled in the first distribution tank 11*a*.

Next, in the state where the ink is filled in the first distribution tank 11*a*, by driving the first collection flow pipe pump P4, the ink flows to the buffer tank 2 from the first distribution tank 11*a* through the first collection flow pipe 53*b*1. Additionally, in the first collection flow pipe pump P4, when the liquid surface of the ink is set to the lower limit position, the driving is stopped. When the liquid surface of the ink is set to the appropriate position, the driving of the first collection flow pipe pump P4 is started.

By carrying out these operations a plurality of times, the ink is filled in the first collection flow pipe 53*b*1.

(Second Distribution Tank)

The initial filling of ink into the second distribution tank is carried out after the initial filling of ink into the first distribution tank 11*b*.

First, a short-circuit tube is attached to the connection pipe attached to the first distribution tank 11*a* and the connection pipe attached to the second distribution tank 11*b*. By attaching the short-circuit tube, the inside of the first distribution tank 11*a* and the inside of the second distribution tank lib are directly connected to each other without passing through the printing head 10.

Next, as a B1 step, when all the solenoid valves D1 on the respective connection pipes between the first distribution tank 11*a* and the respective printing heads 10 are closed, the solenoid valve D2 installed on the bypass pipe 12 is also closed.

Moreover, the inner spaces of the first distribution tank 11*a* and the second distribution tank 11*b* are set to be the atmospheric pressure by the release valves of the pressure adjustment mechanism 13*a* and the pressure adjustment mechanism 13*b*.

Next, as a B2 step, the inner space of the first distribution tank 11*a* is pressurized by the pressure adjusting device 131 of the pressure adjustment mechanism 13*a*. Additionally, the inner space of the second distribution tank lib is maintained at the atmospheric pressure.

In this state, the solenoid valve D2 is opened for a fixed time, by opening the solenoid valves D1 respectively installed in the connection pipes attached to the first distribution tank 11*a* and the connection pipes attached to the second distribution tank 11*b* for a fixed period of time successively, ink flows to the second distribution tank 11*b* from the first distribution tank 11*a*. Additionally, at this time, the inner space of the first distribution tank 11*a* is maintained in the pressurized state.

Moreover, after ink has been filled in the second distribution tank 11*b*, the inner space of the first distribution tank 11*a* is released to the atmospheric pressure by the pressure adjustment mechanism 13*a*.

Next, as a B3 step, by driving the supply flow pipe pump P3, the ink flows into the first distribution tank 11*a* from the buffer tank 2 through the main flow pipe 51 and the supply flow pipe 53*a*. The filling of the ink is carried out until the liquid surface of the ink inside the first distribution tank 11*a* has reached the appropriate position. Moreover, as a B4 step, by driving the second collection flow pipe pump P5, the ink flows into the buffer tank 2 from the second distribution tank lib through the second collection flow pipe 53*b*2. The collection of the ink is carried out until the liquid surface of the ink inside the second distribution tank lib has reached the lower limit position.

In this case, the B1 step, B2 step, B3 step and B4 step are successively repeated.

Thus, ink is filled into the connection pipe between the first distribution tank 11*a* and the respective printing heads 10 and the connection pipe between the second distribution tank lib and the respective printing heads 10, as well as into the second distribution tank and the second collection flow pipe 53*b*2.

As described above, explanations of desired embodiments of the present invention have been given; however, the present invention is not intended to be limited by the above-mentioned embodiments.

In the ink-jet printer 100 in accordance with the present embodiment, float switches F for detecting the liquid surface of ink are respectively installed on the buffer tank 2, the first distribution tank 11*a* and the second distribution tank 11*b*; however, the present invention is not intended to be limited by this, as long as the liquid surface of ink can be detected.

For example, in place of the float switch, another method for measuring by using a laser from the top surface of the tank or for detecting by using a sensor from the side face of the tank, and the like, may be adopted.

In the ink-jet printer 100 in accordance with the present embodiment, thermocouples for measuring the temperature of stored ink in the first distribution tank 11*a* and the second distribution tank lib are installed; however, the present invention is not intended to be limited by this, as long as the temperature thereof can be measured.

For example, in place of the thermocouple, a temperature-measuring resistor or the like may be adopted.

Moreover, in the ink-jet printer 100 in accordance with the present embodiment, theremocouples are installed in the first distribution tank 11*a* and the second distribution tank 11*b*; however, the thermocouple may be installed on either one of the first distribution tank 11*a* and the second distribution tank 11*b*.

For example, the thermocouple may be installed only on the first distribution tank 11*a*. Additionally, from the viewpoint of the temperature control, the thermocouples may be desirably installed on both of the first distribution tank 11*a* and the second distribution tank 11*b*.

In the ink-jet printer 100 in accordance with the present embodiment, the supply flow pipe 53*a* is constituted by the downstream supply flow pipe 53*a*1 connected to the first distribution tank 11*a*, and two upstream supply flow pipes 53*a*2 that are branched from the downstream supply flow pipe 53*a*1 and connected to the manifold 4; however, the present invention is not intended to be limited by this arrangement. That is, the supply flow pipe 53*a* may be one pipe, or the downstream supply flow pipe 53*a*1 may be branched into two pipes.

The ink-jet printer 100 in accordance with the present embodiment is provided with the first collection flow pipe 53*b*1 for use in collecting ink from the first distribution tank 11*a*; however, the first collection flow pipe 53*b*1 is not necessarily required.

The ink-jet printer 100 in accordance with the present embodiment is provided with the bypass pipe 12 for connecting the first distribution tank 11*a* and the second distribution tank lib with each other; however, the bypass pipe 12 is not necessarily required.

Figure 4:
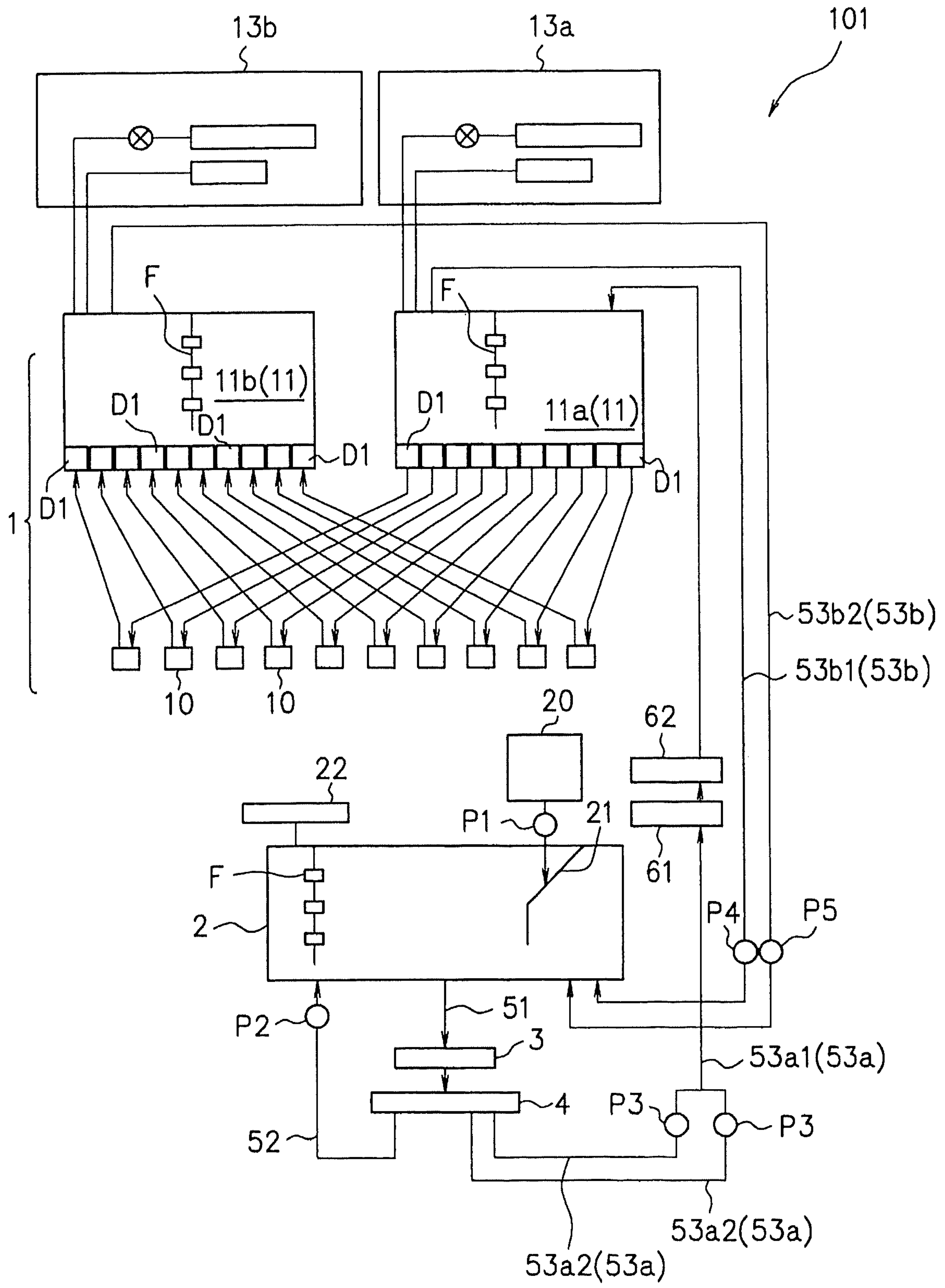
FIG. 4 is a schematic view showing an ink-jet printer in accordance with another embodiment.

FIG. 4 is a schematic view showing an ink-jet printer in accordance with another embodiment.

As shown in FIG. 4, an ink-jet printer 101 in accordance with another embodiment is not provided with the bypass pipe 12.

Additionally, the ink-jet printer 100 is provided with the bypass pipe 12 that makes it possible to eliminate temperature unevenness of ink inside the first distribution tank 11*a* earlier when compared to the ink-jet printer 101 that is not provided with the bypass pipe 12.

In the ink-jet printer 100 in accordance with the present embodiment, a heat exchanger exchanges heat by using ink and water is used; however, the present invention is not intended to be limited by this arrangement.

Moreover, the water temperature is controlled by the chiller device 7; however, the device is not necessarily required.

The ink-jet printer 100 in accordance with the present embodiment is provided with one printing part 1; however, a plurality of printing parts 1 may be installed. That is, the plural printing parts 1 may be provided in the ink-jet printer 100.

Figure 5:
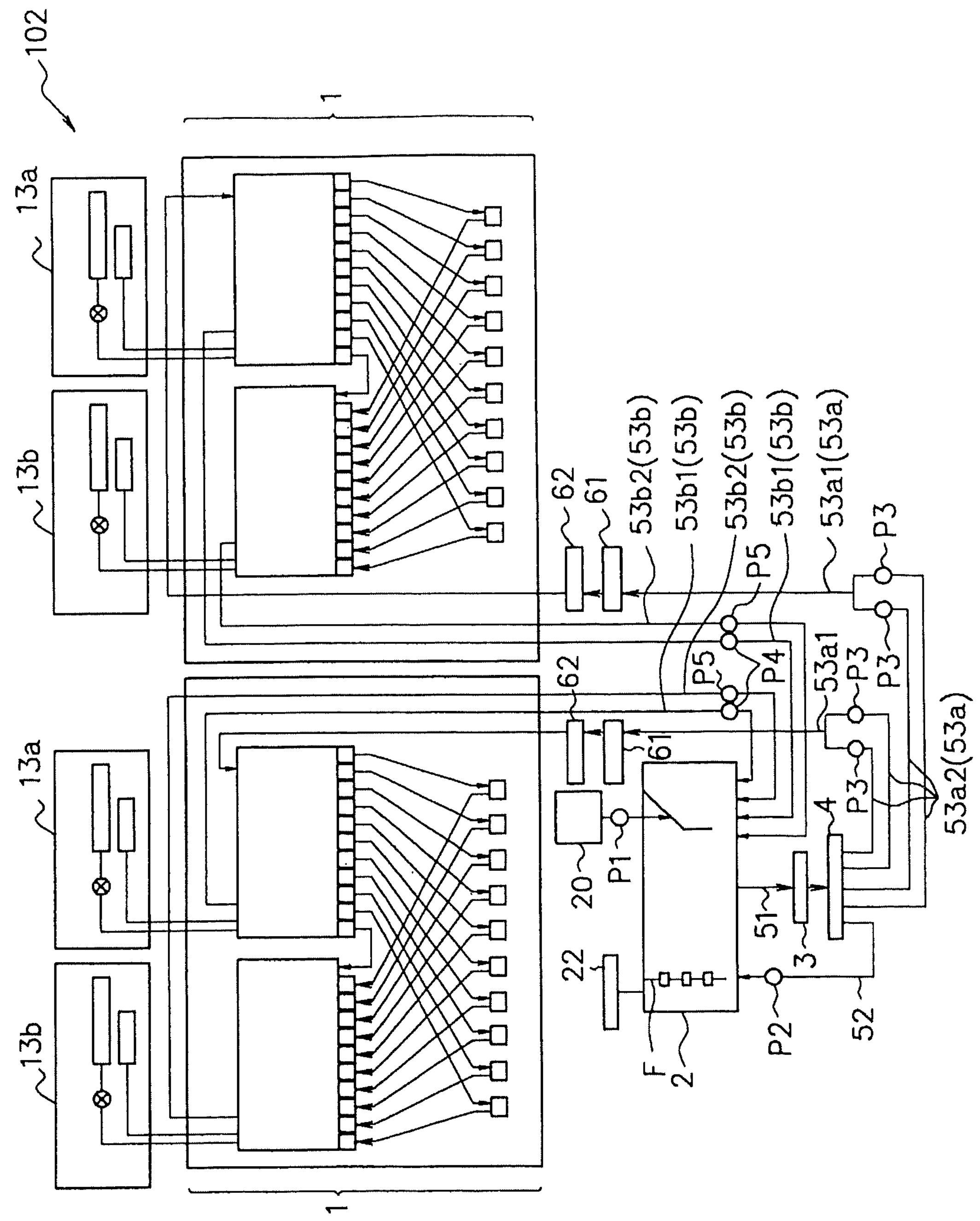
FIG. 5 is a schematic view showing an ink-jet printer in accordance with the other embodiment.

FIG. 5 is a schematic view showing an ink-jet printer in accordance with the other embodiment.

As shown in FIG. 5, an ink-jet printer 102 in accordance with the other embodiment is provided with two printing parts. Thus, it is possible to efficiently carry out a printing process while suppressing the temperature change in ink and aggregation of ink.

Therefore, in the ink-jet printer 102, the second circulation flow passages are formed on one of printing parts 1 and the other printing part 1.

INDUSTRIAL APPLICABILITY

The ink-jet printer of the present invention can be used as a device for applying ink to a printed medium by using an ink-jet system.

Since the ink-jet printer of the present invention is provided with at least two circulation flow passages, it becomes possible to suppress the temperature change in ink and aggregation of ink and efficiently carry out the ink temperature adjustment.

REFERENCE SIGNS LIST

1 . . . printing part,
10 . . . printing head,
11 . . . distribution tank,
11*a* . . . first distribution tank,
11*b* . . . second distribution tank,
12 . . . bypass pipe,
131 . . . pressure adjusting device,
132 . . . pressure meter,
13*a*, 13*b* . . . pressure control mechanism,
100, 101, 102 . . . ink-jet printer,
2 . . . buffer tank,
20 . . . ink pack,
21 . . . slanting part,
22 . . . air filter,
3 . . . heat exchanger,
31*a* . . . water flow inlet,
31*b* . . . water flow outlet,
32*a* . . . ink flow inlet,
32*b* . . . ink flow outlet,
4 . . . manifold,
51 . . . main flow pipe,
52 . . . sub-flow pipe,
53*a* . . . supply flow pipe,
53*a*1 . . . downstream supply flow pipe,
53*a*2 . . . upstream supply flow pipe,
53*b* . . . collection flow pipe,
53*b*1 . . . first collection flow pipe (collection flow pipe),
53*b*2 . . . second collection flow pipe (collection flow pipe),
61 . . . filter,
62 . . . deaeration device,
7 . . . chiller device,
D1, D2 . . . solenoid valve,
F . . . float switch,
P . . . pump,
P1 . . . ink-pack use pump (pump)
P2 . . . sub-flow pipe pump (pump)
P3 . . . supply flow pipe pump (pump)
P4 . . . first collection flow pipe pump (pump)
P5 . . . second collection flow pipe pump (pump)

The invention claimed is:

1. An ink-jet printer provided with a circulation flow passage for circulating ink, comprising:

a printing part having a plurality of printing heads each of which has a nozzle for discharging the ink formed therein and a distribution tank for storing the ink to be distributed to the plurality of printing heads;

a buffer tank for storing the ink;

a heat exchanger for adjusting the temperature of the ink;

a manifold installed at the flow passage of the ink;

a main flow pipe for successively connecting the buffer tank, the heat exchanger and the manifold with one another;

a sub-flow pipe for connecting the manifold and the buffer tank with each other;

a supply flow pipe for connecting the manifold and the printing part;

a collection flow pipe for connecting the printing part and the buffer tank with each other; and pumps that are respectively installed on the sub-flow pipe, the supply flow pipe and the collection flow pipe so as to flow the ink;

the manifold diverges the main flow pipe into the sub-flow pipe and the supply flow pipe;

wherein the main flow pipe and the sub-flow pipe constitute a first circulation flow passage for circulating the ink and the main flow pipe, the supply flow pipe and the collection flow pipe constitute a second circulation flow passage for circulating the ink, wherein the distribution tank is constituted by a first distribution tank and a second distribution tank, and the first distribution tank stores the ink to be supplied to the printing heads and the second distribution tank stores the ink collected from the printing heads, and wherein the collection flow pipe is constituted by a first collection flow pipe that connects the first distribution tank of the printing part and the buffer tank so as to flow the ink from the first distribution tank to the buffer tank, and a second collection flow pipe that connects the second distribution tank of the printing part and the buffer tank so as to flow the ink from the second distribution tank to the buffer tank, and wherein pumps for flowing the ink are respectively installed on the first collection flow pipe and the second collection flow pipe.

2. The ink-jet printer according to claim 1, wherein a pressure control mechanism is attached to each of the first distribution tank and the second distribution tank so that by a pressure adjustment by the pressure control mechanism, the first distribution tank supplies the ink to the printing head and the second distribution tank collects the ink from the printing head.

3. The ink-jet printer according to claim 2, wherein the first distribution tank and the second distribution tank are connected to each other by a bypass pipe so that the ink is directly flowed from the first distribution tank to the second distribution tank.

4. The ink-jet printer according to claim 3, wherein a solenoid valve is attached to the bypass pipe.

5. The ink-jet printer according to claim 1, wherein the first distribution tank and the second distribution tank are connected to each other by a bypass pipe so that the ink is directly flowed from the first distribution tank to the second distribution tank.

6. The ink-jet printer according to claim 5, wherein a solenoid valve is attached to the bypass pipe.

7. The ink-jet printer according to claim 1, wherein the heat exchanger carries out a heat exchanging process between the ink and water, with the temperature of the water being controlled by a chiller device.

8. The ink-jet printer according to claim 1, wherein a plurality of the printing parts are installed.

* * * * *